(12) United States Patent
Zoughi et al.

(10) Patent No.: US 7,746,266 B2
(45) Date of Patent: Jun. 29, 2010

(54) MICROWAVE AND MILLIMETER WAVE IMAGING SYSTEM

(75) Inventors: Reza Zoughi, Wildwood, MO (US); Mohamed Ahmed AbouKhousa, Rolla, MO (US); Mohammad Tayeb Ahmad Ghasr, Rolla, MO (US); Sergiy Kharkivskiy, Rolla, MO (US); David Pommerenke, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 66 days.

(21) Appl. No.: 12/052,589

(22) Filed: Mar. 20, 2008

(65) Prior Publication Data

US 2009/0237092 A1 Sep. 24, 2009

(51) Int. Cl.
*G01S 13/89* (2006.01)
(52) U.S. Cl. .......................................... 342/22; 342/179
(58) Field of Classification Search .................... 342/22
See application file for complete search history.

(56) References Cited

U.S. PATENT DOCUMENTS

| | | | |
|---|---|---|---|
| 4,006,425 A | 2/1977 | Chang et al. | |
| 4,086,511 A | 4/1978 | Redman | |
| 4,280,055 A | 7/1981 | Gerharz | |
| 4,499,474 A * | 2/1985 | Muhs et al. | 343/771 |
| 4,552,151 A | 11/1985 | Bolomey et al. | |
| 4,805,627 A | 2/1989 | Klingenbeck et al. | |
| 4,885,592 A * | 12/1989 | Kofol et al. | 343/754 |
| 4,896,033 A | 1/1990 | Gautier | |
| 4,901,084 A * | 2/1990 | Huguenin et al. | 342/179 |
| 4,910,523 A | 3/1990 | Huguenin et al. | |
| 4,916,457 A * | 4/1990 | Foy et al. | 343/770 |
| 5,047,783 A | 9/1991 | Hugenin | |
| 5,073,782 A | 12/1991 | Huguenin et al. | |
| 5,128,621 A | 7/1992 | Berthaud et al. | |
| 5,170,169 A * | 12/1992 | Stephan | 342/179 |
| 5,202,692 A | 4/1993 | Huguenin et al. | |
| 5,227,800 A | 7/1993 | Huguenin et al. | |
| 5,327,139 A | 7/1994 | Johnson | |
| 5,365,237 A | 11/1994 | Johnson et al. | |
| 5,430,369 A | 7/1995 | Bolomey et al. | |
| 5,455,590 A * | 10/1995 | Collins et al. | 342/179 |
| 5,557,283 A | 9/1996 | Sheen et al. | |
| 5,760,397 A | 6/1998 | Huguenin et al. | |
| 5,859,609 A * | 1/1999 | Sheen et al. | 342/179 |
| 5,861,839 A * | 1/1999 | Upton et al. | 342/350 |
| 5,933,120 A | 8/1999 | Manasson et al. | |
| 5,977,924 A * | 11/1999 | Takei et al. | 343/770 |

(Continued)

OTHER PUBLICATIONS

Notification of Transmittal of The International Search Report and the Written Opinion of the International Searching Authority in International Application No. PCT/US09/36272, dated Dec. 29, 2009, 10 pgs.

*Primary Examiner*—Thomas H Tarcza
*Assistant Examiner*—Matthew M Barker
(74) *Attorney, Agent, or Firm*—Senniger Powers LLP

(57) ABSTRACT

A sensor array having a plurality of modulated slots for microwave and/or millimeter wave imaging. The locations of the slots in the array define a spatial domain away from an object for detecting an electric field from the object. Each of the slots outputs a signal representative of the measured field and the location of the slot. A processor decodes the signals and generates an image of the object.

37 Claims, 12 Drawing Sheets

U.S. PATENT DOCUMENTS

| | | |
|---|---|---|
| 5,991,036 A | 11/1999 | Frankel |
| 6,008,770 A * | 12/1999 | Sugawara .................... 343/767 |
| 6,057,761 A * | 5/2000 | Yukl ........................ 340/568.1 |
| 6,075,493 A * | 6/2000 | Sugawara et al. ............ 343/767 |
| 6,127,985 A * | 10/2000 | Guler ......................... 343/771 |
| 6,448,788 B1 | 9/2002 | Meaney et al. |
| 6,456,241 B1 * | 9/2002 | Rothe et al. ............ 343/700 MS |
| 6,476,772 B1 * | 11/2002 | Smith et al. .................. 343/771 |
| 6,535,173 B2 * | 3/2003 | Ou ............................. 343/770 |
| 6,563,462 B1 | 5/2003 | Moffa et al. |
| 6,657,580 B1 | 12/2003 | Edwards et al. |
| 6,677,769 B2 | 1/2004 | Whitaker et al. |
| 6,703,964 B2 * | 3/2004 | McMakin et al. ............. 342/22 |
| 6,762,726 B2 | 7/2004 | Alden et al. |
| 6,777,684 B1 * | 8/2004 | Volkov et al. ............ 250/341.1 |
| 6,828,556 B2 | 12/2004 | Pobanz et al. |
| 6,876,322 B2 * | 4/2005 | Keller ......................... 342/22 |
| 6,927,691 B2 * | 8/2005 | Yukl ........................ 340/568.1 |
| 6,943,742 B2 | 9/2005 | Holly |
| 6,974,415 B2 | 12/2005 | Cerwin et al. |
| 6,992,616 B2 | 1/2006 | Grudkowski et al. |
| 7,034,746 B1 * | 4/2006 | McMakin et al. ........... 342/179 |
| 7,075,080 B2 | 7/2006 | Vaidya |
| 7,082,230 B2 | 7/2006 | Huang et al. |
| 7,180,441 B2 | 2/2007 | Rowe et al. |
| 7,256,377 B2 | 8/2007 | Alton et al. |
| 7,304,603 B2 * | 12/2007 | Reed et al. ................... 342/188 |
| 7,385,549 B2 * | 6/2008 | Lovberg et al. ............... 342/22 |
| 2003/0034444 A1 * | 2/2003 | Chadwick et al. ........... 250/225 |
| 2004/0077943 A1 | 4/2004 | Meaney et al. |
| 2004/0090359 A1 * | 5/2004 | McMakin et al. ............. 342/22 |
| 2004/0140924 A1 * | 7/2004 | Keller et al. .................. 342/22 |
| 2005/0122257 A1 * | 6/2005 | Rowe et al. .................. 342/179 |
| 2005/0122258 A1 * | 6/2005 | Blasing et al. ............... 342/179 |
| 2005/0231415 A1 * | 10/2005 | Fleisher et al. ................ 342/22 |
| 2005/0231417 A1 * | 10/2005 | Fleisher et al. ................ 342/22 |
| 2005/0232459 A1 * | 10/2005 | Rowe et al. .................. 382/100 |
| 2005/0232487 A1 * | 10/2005 | Fleisher ...................... 382/181 |
| 2006/0066469 A1 * | 3/2006 | Foote et al. ................... 342/22 |
| 2006/0104480 A1 * | 5/2006 | Fleisher ...................... 382/103 |
| 2006/0241410 A1 | 10/2006 | Fang et al. |
| 2007/0152898 A1 | 7/2007 | Mizuno et al. |
| 2008/0111735 A1 * | 5/2008 | Ridgway et al. ............. 342/200 |
| 2008/0169992 A1 * | 7/2008 | Ortiz et al. ................... 343/767 |

\* cited by examiner

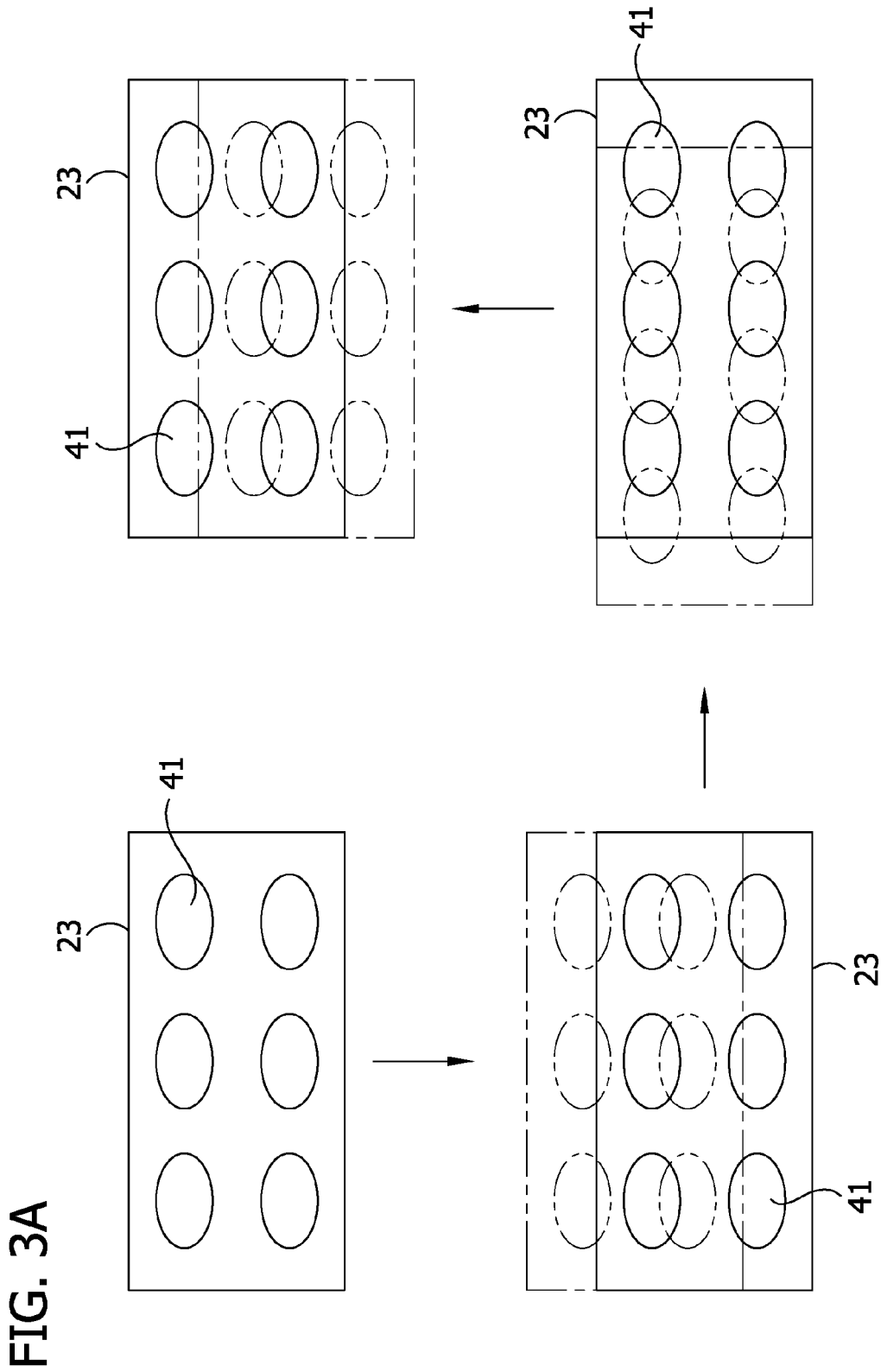

MICROWAVE AND MILLIMETER WAVE IMAGING SYSTEM

STATEMENT OF GOVERNMENT INTEREST

The U.S. Government has a paid-up license and the right in limited circumstances to require the patent owner to license others on reasonable terms as provided by the terms of grant number NNM06AA06G awarded by the National Aeronautics and Space Administration (NASA), Marshall Space Flight Center.

BACKGROUND

Non-destructive, real-time imaging known in the art uses electromagnetic radiation to detect properties of an object under inspection. Generally, an electromagnetic field source illuminates the object and an array of sensor elements receives the electric field scattered by the object. Each sensor signal typically requires separate pickup circuitry for discriminating one signal from another. For example, conventional modulated scattering techniques (MST) for imaging use inefficient dipole antennas to sample the field and, thus, are not sufficiently sensitive, particularly for fields at higher frequencies. Switched antenna array techniques for imaging require expensive and bulky radio frequency (RF) circuitry for each pickup antenna to detect the electromagnetic field from each array element's location. Unfortunately, such conventional switched antenna array imaging does not provide sufficient resolution, particularly at higher frequencies.

SUMMARY

Imaging systems and methods embodying aspects of the invention provide an array of modulated slots receiving and responsive to microwave and/or millimeter wave electromagnetic radiation. The locations of the slots in the array define a spatial domain away from an object for detecting an electromagnetic field scattered by the object. Each of the slots outputs a signal representative of the detected field and the location of the slot. By decoding the signals, an image of the object can be generated. Aspects of the invention permit high measurement sensitivity, high spatial resolution, real-time operation, and portability.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Other features will be in part apparent and in part pointed out hereinafter.

BRIEF DESCRIPTION OF THE DRAWINGS

FIGS. 3A and 3B illustrate exemplary positions of an array of slots according to embodiments of the invention.

Corresponding reference characters indicate corresponding parts throughout the drawings.

DETAILED DESCRIPTION

Figure 1:
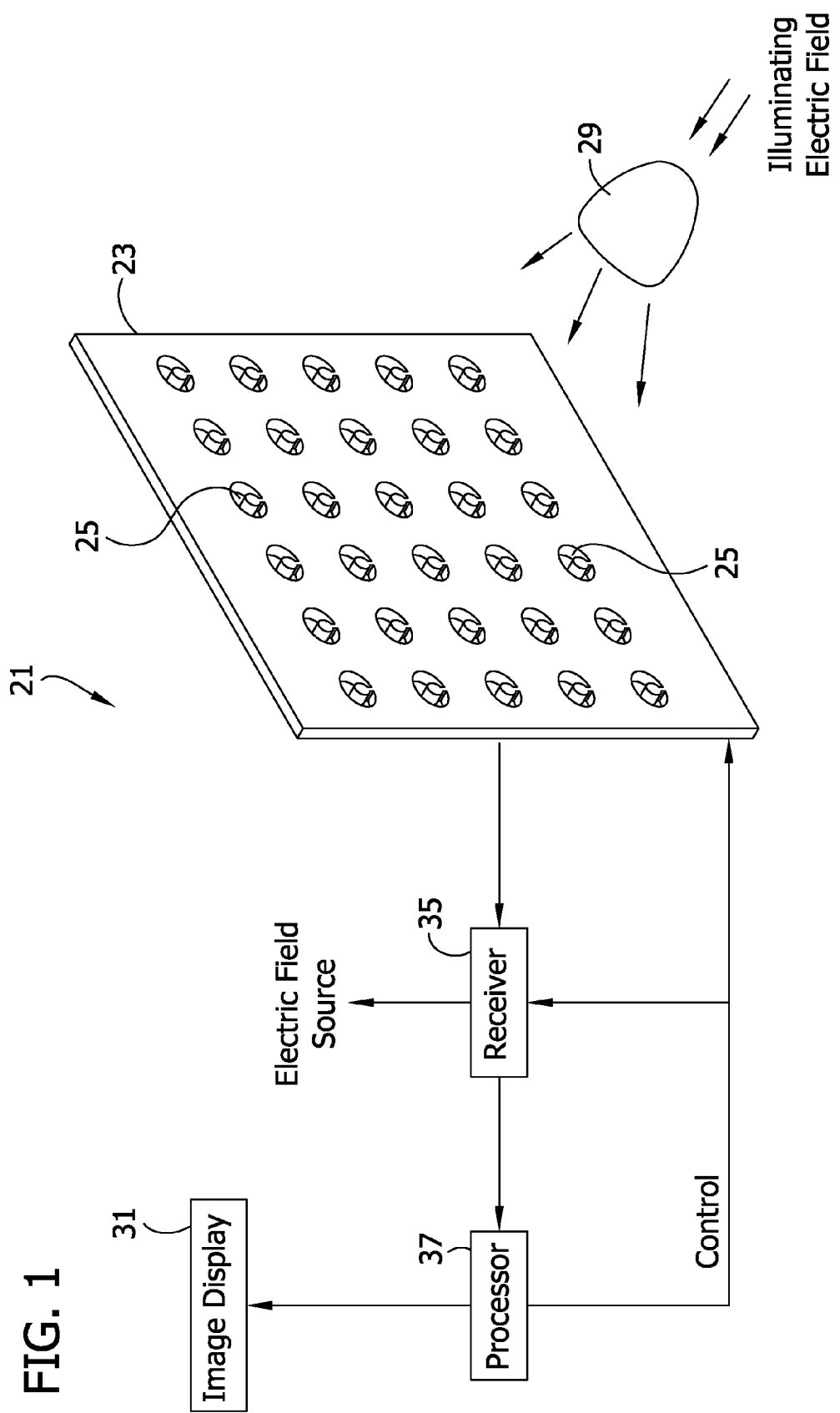
FIG. 1 illustrates a microwave and millimeter wave imaging system embodying aspects of the invention.

Referring now to FIG. 1, an imaging system 21 embodying aspects of the invention provides a robust and highly sensitive system, especially for use at relatively high frequencies such as those in the microwave and millimeter wave regions of the electromagnetic spectrum (i.e., greater than ultra high frequency). In at least one embodiment, the imaging system 21 includes an array 23 for sampling an electric field. The array 23, also referred to as a "retina," has many array elements, or sensors 25, distributed over the retina's spatial extent. As described in greater detail below, an embodiment of the microwave and millimeter wave imaging system 21 implements its sensors 25 using modulated slot antennas (see FIG. 2) cut into or otherwise formed in a conducting screen, printed-circuit board (PCB) substrate, or the like. Advantageously, modulating the slots allows each slot in the array 23 to tag or otherwise identify its own output signal with a unique code for distinguishing one slot from another.

According to aspects of the invention, imaging system 21 produces substantially real-time images of virtually any object 29 present in the system's field-of-view. When illuminated by the electromagnetic field, the target object 29 causes at least some of the field to scatter in different directions as a function of the object's material and geometrical properties. For instance, the illuminating electromagnetic field is associated with incident or irradiating microwaves or millimeter waves. Because microwaves and millimeter waves penetrate into dielectric materials, the imaging system 21 can view the interior of an object that comprises such a material. Likewise, imaging system 21 can detect and image an object concealed or otherwise located inside of a dielectric material. The imaging system 21 measures the scattered electric field at a number of discrete locations corresponding to a defined spatial domain (e.g., a planar, cylindrical, spherical, or arbitrarily shaped portion of a plane) located away from the object 29.

The imaging system 21 also permits inspection of a source of electromagnetic radiation. For example, object 29 may itself emit microwave and/or millimeter wave electromagnetic radiation that can be measured at array 23.

Depending on the desired usage of system 21, sensor array 23 can be custom-designed to take different shapes. For example, array 23 can be made of one-dimensional, two-dimensional, or three-dimensional distributions of sensors 25. In an alternative embodiment, sensor array 23 can be made of a flat or an arbitrarily curved conducting surface (any shape that is conformed to a rectilinear or curvilinear grid (rectangle, square, triangle, circle, arc, cone, box, hemisphere, sphere, etc.)). FIG. 1 illustrates an exemplary two-dimensional array of sensors 25 arranged in a rectangular pattern.

As shown in FIG. 1, the array 23 is integrated with other system components, which include a display 31 as well as a receiver 35 and a processor 37. The receiver 35 receives a signal from each sensor element in the array 23 and communicates this information to the processor 37. Because the sensors' output signals are distinguishable from each other, processor 37 knows which signal that receiver 35 receives from which sensor 25. In an embodiment, system 21 utilizes a single receiver 35 for receiving signals from multiple sensors 25. By properly arranging (both spatially and electronically) the signals received at receiver 35 from sensors 25, processor 37 obtains a sampled version, or map, of the actual electromagnetic field incident upon the area of the array 23 from the object 29 being imaged. The processor 37 subsequently processes this map to generate an image of the illuminated object 29. The processor 37, which is responsible for arranging the signals received from each sensor 25 and performing any higher level processing, controls the system timing for electronic tagging and synchronization.

Using special processing of the measurements at the discrete locations (i.e., at the locations of sensors 25), system 21 generates an image of the object's spatial and/or dielectric profiles on a display 31. For example, imaging system 21 generates and displays a multi-dimensional (i.e., 2D or 3D) image of object 29, such as a holographical image.

Figure 2:
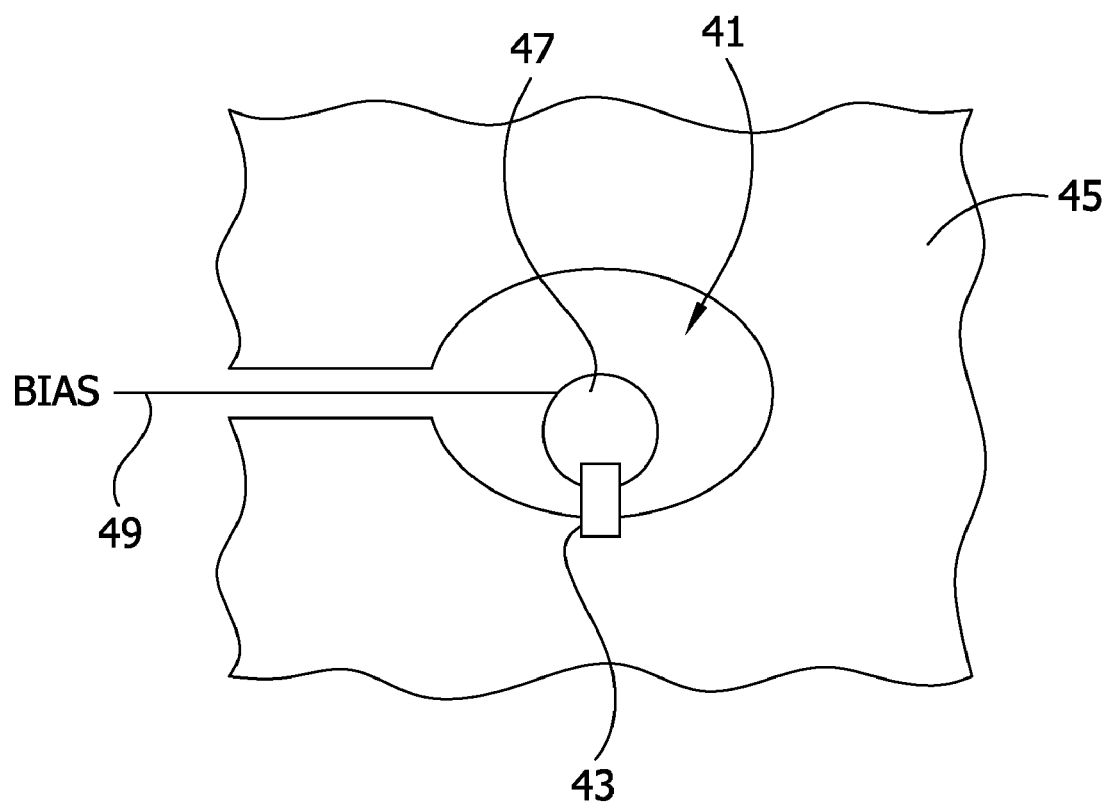
FIG. 2 illustrates an exemplary slot antenna suitable for use in an array of the system of FIG. 1.

FIG. 2 illustrates an exemplary slot 41 suitable for use as one of the sensors 25. Loading the slot 41 with an electronically or optically controllable load permits modulating the signal passed by the slot to distinguish the electromagnetic field measured at this location from that measured at a different location. In this instance, an active element 43, such as a diode, is electrically connected across the slot 41 for loading and, thus, modulating the slot 41. As an example, each slot 41 is cut into a conductive screen 45 according to a pattern defining array 23. The active element 43 (e.g., PIN (Positive Intrinsic Negative) diode, varactor diode, photodiode) electrically connects the conductive screen 45 at an edge margin of the respective slot 41 to a conductor 47 positioned within the periphery of each slot 41. In the illustrated embodiment, direct electrical or optical biasing changes the electronic load value of the active element 43. For electrical load control, a dedicated bias line 49 routed to each individual load (or a matrix switch) provides a biasing voltage in the illustrated embodiment. DC bias controls the diode impedance; basically switching the diode ON and OFF. For a PIN diode, for example, applying a zero or negative DC bias voltage across the diode junction turns the diode OFF so that the respective slot 41 outputs a signal representative of the electric field at its location in the array 23. When it is forward biased, the PIN diode turns ON thus blocking the output from the respective slot 41. Loading the slot 41 in this manner essentially changes the slot's capacitance, which in turn changes its resonant frequency. In one embodiment, the active element 43 is electrically connected to a corresponding one of the slots 41 at the location of its maximum electric field strength.

As described in greater detail below, the size, the shape and spacing of slots 41 depends on certain operational characteristics of imaging system 21. For example, the slot 41 of FIG. 2 has a length greater than its width (length=0.1866 inches; width=0.1400 inches). In this example, the conductor 47 has a radius of 0.0311 inches and is located midway along the length of slot 41. The center of conductor 47 is positioned 0.0228 inches off-center relative to the width of slot 41. The bias line 49 resides in a channel in conductive screen 45 (0.0160 inches from the edge of the channel).

Referring further to FIG. 2, active element 43 functions to modulate its corresponding slot 41. When active element 43 is OFF, slot 41 passes a signal representative of the electric field incident on the array 23 at its location. But when active element 43 is ON, slot 41 does not pass such a signal. The processor 37 triggers operation of active element 43 to modulate slot 41 and, thus, tag its signal with information identifying its location relative to the other sensors 25 of array 23.

As arranged to form array 23, the plurality of slots 41 provide for high measurement sensitivity and spatial resolution at relatively higher frequencies. The array 23, which includes modulated slots 41 cut into conductive screen 45 (e.g., a metal plate) is unpredictably well-suited for electric field mapping at microwave and millimeter wave frequencies. Conventional imaging systems, by contrast, avoid materials such as conducting metals around active elements because of their tendency to reflect back the electromagnetic waves. The array 23 is subsequently integrated with other system components, including receiver circuitry, processing circuitry, and display circuitry (i.e., receiver 35, processor 37, and display 31, respectively). Using special processing of the measurements at the discrete locations, the system 21 generates multi-dimensional images of the object's spatial and/or dielectric profiles (e.g., holographical images).

In one embodiment, the array sensors 25 (i.e., modulated slots 41) are placed within close proximity of each other to provide appropriate sampling of the electromagnetic field from object 29. Moreover, the design of slot 41 beneficially affords weak mutual coupling between adjacent slots. Using the slot 41 as an array element (i.e., sensor 25) allows for optimizing electromagnetic field sampling performance by reducing the spacing and mutual coupling between the sensors 25, which are otherwise two opposing objectives. Each of the sensors 25 passes a signal proportional to the field at the particular element's location in array 23.

By detecting relatively small changes in the electric field over the area of sensor array 23, the imaging system 21 permits highly sensitive observation of subtle object features in the obtained image. Moreover, imaging system 21 rapidly samples the electric field to provide substantially real-time operation. And because sensor array 23 is relatively compact and has closely-spaced sensors 25 in at least one embodiment of the invention, imaging system 21 provides images of high fidelity and spatial resolution.

The sensors 25, embodied by slot antennas 41 and incorporated into array 23, may take various designs, such as sub-resonant slots or resonant slots, depending on the particular application of the system 21. Moreover, available modulation types include sequential, parallel, and hybrid. Sequential modulation involves modulating one slot at a time while parallel modulation involves modulating a plurality of slots at the same time (e.g., using orthogonal modulation codes). In a hybrid modulation type where some slots are modulated in parallel and some are sequentially modulated, different modulation patterns are possible.

Further aspects of the invention relate to loading the modulated slots 41 with active element 43 to affect the transmission properties of the slots. For example, modulated slots 41 can be resonant, sub-resonant, wide-band, reconfigurable resonant, and shape reconfigurable. Resonant slots have a compact design (e.g., slot spacing less than $\lambda_0/2$, where $\lambda_0$ is the free space wavelength) and are narrow-band but have a relatively high sensitivity. In other words, slots 41 open and close efficiently at a single frequency. Sub-resonant modulated slots are similarly compact in design with a relatively low sensitivity but can be used over a wider range of frequencies. Efficiency is a trade-off of a wider band of operation. Wideband slots are larger elements with moderate sensitivity over a range of frequencies. As an example, slot spacing between wide-band slots is in the order of $\lambda_0/2$. Advantageously, the wider band of frequencies permits holography. Reconfigurable resonant slots are resonant slots with variable loading conditions (e.g., through the use of varactor diodes, PIN diodes, and the like) to control the resonance frequency for swept frequency operation. In other words, electrically loading the slots, through the use of one or more additional active elements, changes the resonant frequency of the slots in a predictable and well-controlled manner. Shape reconfigurable slots have fixed sizes larger than may be needed and are loaded with multiple PIN diodes that are selectively activated to electronically change the slot dimensions and hence its frequency response (i.e., narrow-band vs. wide-band operation). For example, a shape reconfigurable slot of 1 cm in length may have an active element located every 1 mm. By loading the slot differently at different positions (depending on which of the several elements are used to load the slot), selected discrete or overlapping portions of the slot may be opened and closed. In an alternative embodiment, the shape reconfigurable slots are constructed out of a highly spatial selective screen material, such as a liquid-crystal polymer (LCP), so that narrow-band as well as wide-band slots can be realized. This design is based on locally changing the effective permittivity of the LCP via electrical control. Independent and localized changes in permittivity of the LCP create the pixels (i.e., slots) that are used to sample the scattered field. Those skilled in the art are familiar with LCP materials, which have electrical characteristics responsive to an applied voltage.

Referring again to FIG. 1, processor 37 decodes the signals obtained via array 23 by receiver 35 to generate the image of object 29 and to generate control signals for modulating sensors 25. In one embodiment, processor 37, in the form of a computer, interfaces with array 23 via a data acquisition (DAQ) card and executes software to generate control signals, including modulation signals. The DAQ card acquires the modulated sensor signals from pickup circuitry (i.e., receiver 35) and subsequently processes and decodes the signals in software. Each of the decoded signals is arranged according to its respective slot location for displaying on the computer's screen, that is, display 31.

Alternatively, a high speed digital signal processor (DSP), which interfaces with an analog-to-digital converter and display 31, embodies processor 37.

In yet another alternative embodiment, processor 37 comprises a custom-made circuit, such as a digital switching network made from discrete components or a field programmable gate array, for generating the control signals. Each modulated sensor signal is decoded in hardware using analog or digital processing techniques. The processor 37 acquires the decoded signal via a DAQ card or the like for processing the sampled measurements and generating the image for display.

One skilled in the art will recognize that various combinations of the integration schemes described above may be used to generate the control signals and decode the resulting modulated signals without deviating from the scope of the invention. System integration allows for a portable imaging system 21 to be deployed. In addition, one or more of the interfaces between the system components are wireless interfaces (e.g., the signal can be acquired or displayed remotely).

Aside from the raw image of the electric field map over the retina area (i.e., the area of array 23), imaging system 21 applies spatial and/or temporal focusing techniques (e.g., synthetic aperture focusing, back-propagation, beam-forming, holographic techniques, etc.) known to those skilled in the art to obtain 2D and 3D profiles of the geometry/shape and the dielectric properties of the imaged object 29.

Figure 3B:
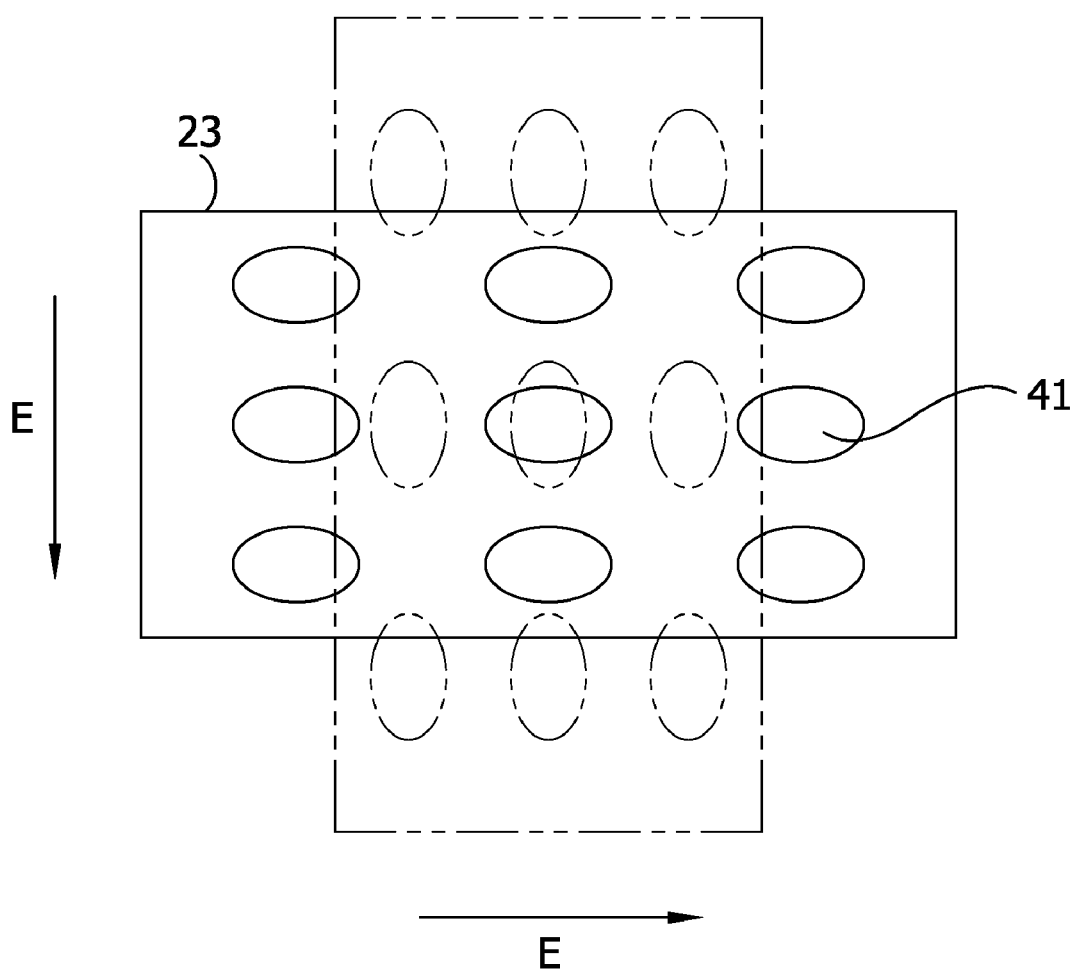

Referring now to FIGS. 3A and 3B, aspects of the invention enhance the performance of the imaging system 21 to obtain higher resolution and/or sensitivity and the like. For example, array 23 is scanned (i.e., mechanically moved) and/or arranged with similar sensor arrays to obtain 3D maps of the scattered electric field. Alternatively, array 23 is displaced in two orthogonal directions to increase the number of samples obtained per wavelength. In other words, imaging system 21 includes means for providing translational movement of array 23, generating the images of object at each position and processing these images to obtain an image with higher spatial resolution and fidelity.

The array 23 of FIG. 3A has a plurality of slots 41 (e.g., six slots are shown in FIG. 3A for convenience). It is to be understood that array 23 may include any number of slots 41. For example, the positions of six slots of array 23 are shown in FIG. 3A undergoing one or more translational displacements. In the illustrated embodiment, array 23 is first shifted down, across, and then up, with the previous position being indicated by broken lines. The horizontal displacement may be to the right or to the left. Performing the displacement, image generation, and signal processing actions quickly allows the imaging process to remain in real time. As an example, the displacement is a half the sensors' spacing.

Referring now to FIG. 3B, the modulated slots 41 in one embodiment are sized and shaped to be linearly polarized. For example, modulated slot 41 as shown in FIG. 2 has a generally longitudinal shape that passes a component of the scattered electric field in one direction but blocks components of the field in other directions. According to aspects of the invention, measuring the scattered electric field at different polarizations increases the amount of geometrical and materials information revealed about the imaged object 29. Because polarization involves the spatial orientation of the electric field, the imaging system 21 can be designed to measure electric fields at its array 23, or retina, in several polarizations. The ability to measure different polarizations increases the amount of information revealed about the imaged object 29. For example, sensors 25 each comprise a linearly polarized modulated slot 41 to measure a component of the electric field. Using linearly polarized modulated slots 41 allows array 23 to measure the scattered electric field in an orthogonal direction by rotating the retina 90 degrees about a central point as shown in FIG. 3B from a vertical polarization to a horizontal polarization (shown with broken lines). Again, performing the rotation action quickly allows the imaging process to remain in real time. It is to be understood that the amount and direction of rotation may vary according to the implementation of imaging system 21.

Alternatively, two sets of linearly polarized sensor elements arranged in the retina space allow measurements of two orthogonal electric field components (sequentially or simultaneously). In this alternative embodiment, the sensors 25 in one set comprise slots 41 oriented along a first direction and the sensors 25 in the other set comprise slots 41 oriented along a second direction that is orthogonal to the first direction. In yet another alternative embodiment, sensors 25 comprise dual-polarized sensor elements with electrical control over the polarization for measuring two orthogonal electric field components (sequentially or simultaneously).

In another embodiment array 23 is scanned (i.e. mechanically moved) to obtain higher spatial resolution and/or to increase the dimensions of irradiating area. For example, array 23 with the two sets of the sensors 25 (see [0038]) or linear array 23 can be translationaly moved near the object.

The general operation described above is independent of the source of illumination (e.g., an antenna) and, depending on the source of electromagnetic field illumination, different modes of operation are possible. Unlike the human eye's retina, which only receives the light energy scattered from objects, the sensor array 23, or retina, may be used for transmitting, in addition to receiving, microwave and/or millimeter wave energy. The imaging system 21 can be passive in the sense that it receives signals representative of an electric field generated by an independent source and scattered by object 29. In this passive mode, an independent source produces the illuminating field so imaging system 21 can obtain a spatial map of the scattered electric field. Generally, this independent source is outside the retina spatial domain and not part of array 23. Similarly, object 29 itself emits electromagnetic radiation independently of imaging system 21. On the other hand, in an active operational mode, the source of the illuminating electric field is part of the imaging system 21. When operating in the active mode, one or more sensors 25 constitute a radiating source built within the retina region for illuminating object 29 as array 23 samples the scattered electric field. The active mode provides a wide breadth of use in many applications and promotes portability because different patterns corresponding to different locations and distributions may be generated. It is to be understood that the configuration of FIG. 1 is merely exemplary and various configurations are contemplated within the scope of the invention. For example, the target object 29 may be positioned between an external electric field source and the array 29 as shown in FIG. 1. In yet another alternative embodiment, the electric field radiates from the array 23 itself, strikes object 29, and then is scattered back toward array 23.

Referring again to FIG. 1, receiver 35 is capable of working as a transceiver (receiver/transmitter) depending on the mode of operation (active/passive). For passive operation, receiver 35 works as receiver only (listening only). In the active mode, receiver 35 also has an electric field source that provides the illuminating signal through an antenna or the like. In this instance, receiver 35 not only initiates the transmitted signal but also receives the signals from the array 23 and puts them in a form suitable for further processing (e.g., pre-conditioning and down-conversion) by processor 37.

Figure 4:
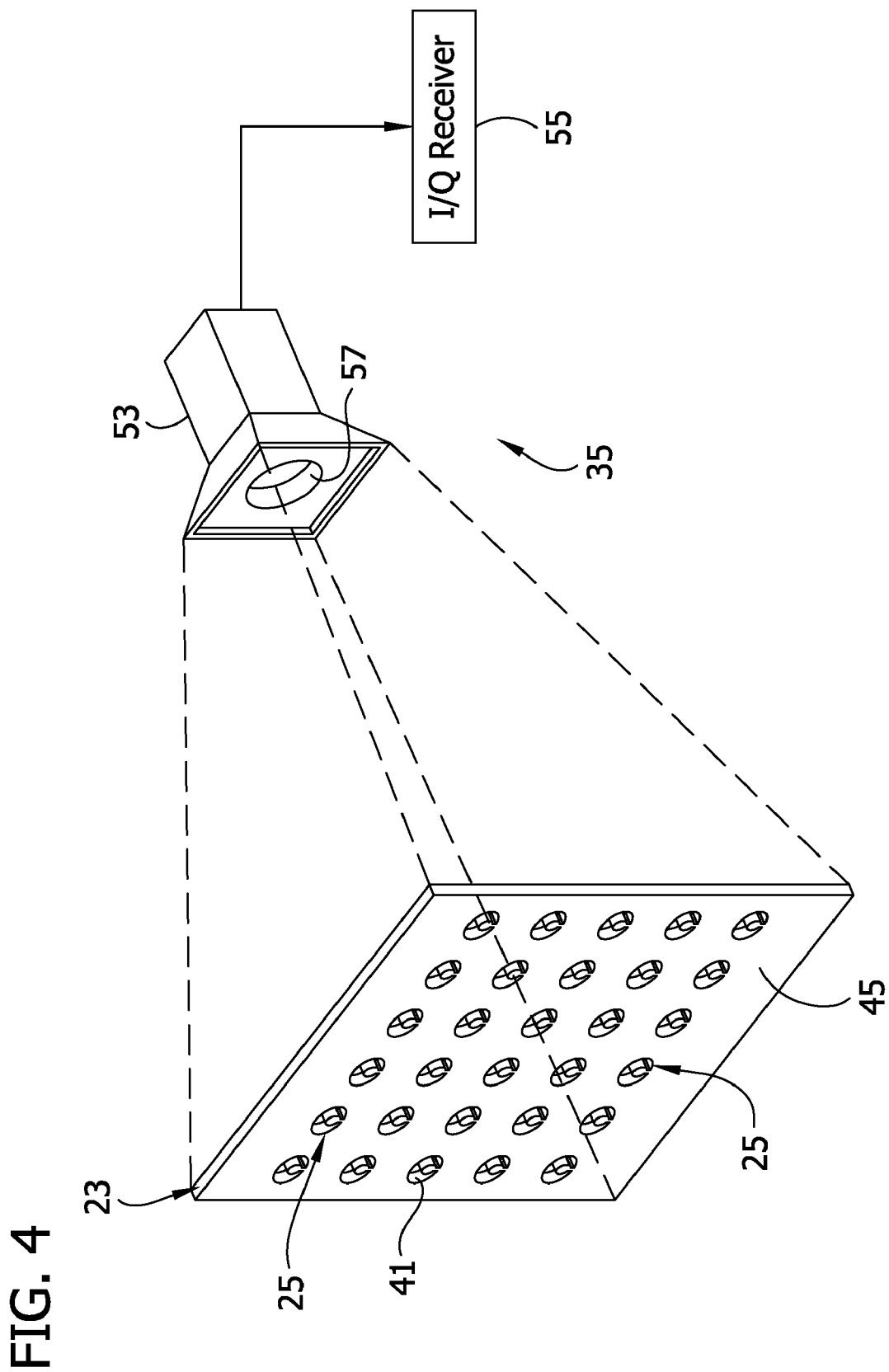
FIG. 4 illustrates an imaging system having an array of modulated slot antennas and a collector for receiving signals from the slot antennas according to an embodiment of the invention.

Referring now to FIG. 4, sensors 25 comprise modulated slot antennas 41 in the illustrated embodiment. The receiver 35 receives the sampled electric field via the slots 41. As an example, receiver 35 comprises a radio frequency (RF) circuit having one or more pickup antennas that combine the final signal. It is to be understood that receiver 35 may be located away from array 23.

FIG. 4 schematically illustrates array 23 with resonant modulated slots 41 and receiver 35 (i.e., a collector 53 and an inphase and quadrature (I/Q) receiver 55 for receiving re-radiated signals from array 23). The I/Q receiver 55 in this embodiment down-converts (translates) the high frequency RF signal from the collector 53 to a low-pass (low frequency) signal suitable for further processing. This is a direct conversion, where the RF signal is down-converted directly to DC (zero frequency). To this end, I/Q receiver 55 comprises, for example, two balanced mixers driven by local oscillator signals that are 90 degrees out of phase from one another. In an alternative embodiment, receiver 35 includes a super-heterodyne receiver or the like whereby the RF signal is first down-converted to a single or multiple intermediate-frequency (IF) stages and then further down-converted to the frequency at which detection is desired (e.g., DC). Signal conditioning (amplification and filtering) can be applied in the IF stages. Those skilled in the art will understand that other high-frequency receiver technologies such as a six-port junction receiver can also be used without deviating from the scope of the invention.

In FIG. 4, imaging system 21 embodies a microwave system, wherein the modulated slots 41 of array 23 are cut into conducting screen 45. For example, array 23 has 30 slots arranged in a 6 by 5 pattern having a spacing of $\lambda_0/2$ (where $\lambda_0$ is the free space wavelength) and operating at a frequency of 24 GHz (K-band).

Advantageously, the array 23 of FIG. 4 utilizes high-Q compact resonant slots 41 that are loaded with fast switching active elements 43, namely, PIN diodes. This improves switching speed and modulation depth, which are important parameters of an imaging system based on a rapid modulated scatterer technique (MST). As an example, the PIN diode switches in under 3 nS, while the slot goes from a very low insertion loss (−20 dB) to a very high insertion loss (−2 dB) when the diode switches. This provides a large modulation depth with a relatively fast switching speed (i.e., rapid field measurement). The large modulation depth and the fact that coherent averaging over several modulated periods is readily possible, provides the system 21 with a relatively high signal-to-noise ratio (SNR).

In addition, the slots 41 of FIG. 4 are efficient and exhibit very little mutual coupling. Although the longest dimension of slot 41 is less than $\lambda_0/3$ in this embodiment, it is resonated to work at the frequency of interest by special loading. Slot spacing of $\lambda_0/2$ ensures adequate sampling of the scattered electric field without sacrificing signal fidelity, which is adversely affected by mutual coupling. The electric field scattered by the object 29 to be imaged reaches the plane of array 23 and the respective electric field at the particular location of each slot 41 is coupled into that slot. Subsequently, this signal is re-radiated into the opposite side of the array 23.

Referring further to FIG. 4, using the PIN diodes as active elements 43, each slot 41 is modulated at a certain modulation rate. In this manner, the electric field due to each slot 41 can be individually discriminated and measured. Modulation allows the field from object 29 to be unambiguously determined over a planar region of interest. To pick up the modulated field from each slot 41, the collector 53 of receiver 35 comprises a rectangular waveguide placed behind the screen 45 that forms array 23 and having a resonant slot 57 at its aperture. This collector 53 has the advantages of a very small insertion loss and a wide radiation pattern engulfing array 23 within its main lobe. Having a single collector allows the use of a single RF front-end without the use of complex microwave combiners. A combination of a relatively large retina (i.e., planar array 23) and a relatively small collector 53, as shown in FIG. 4, results in non-uniform coupling coefficients between each array sensor 25 (i.e., slot 41) and collector 53, both in magnitude and phase. To correct for these coefficients, they are measured by applying a uniform plane-wave on the array 23. Because the measured field has a uniform magnitude and known phase distribution, any variation from that norm, is considered the sole effect of the array 23. Consequently, any subsequent measurement is referenced to the uniform plane wave measurement. Finally, the I/Q detector 55 measures the magnitude and phase of the received re-radiated signal by each slot 41.

Figure 5A:
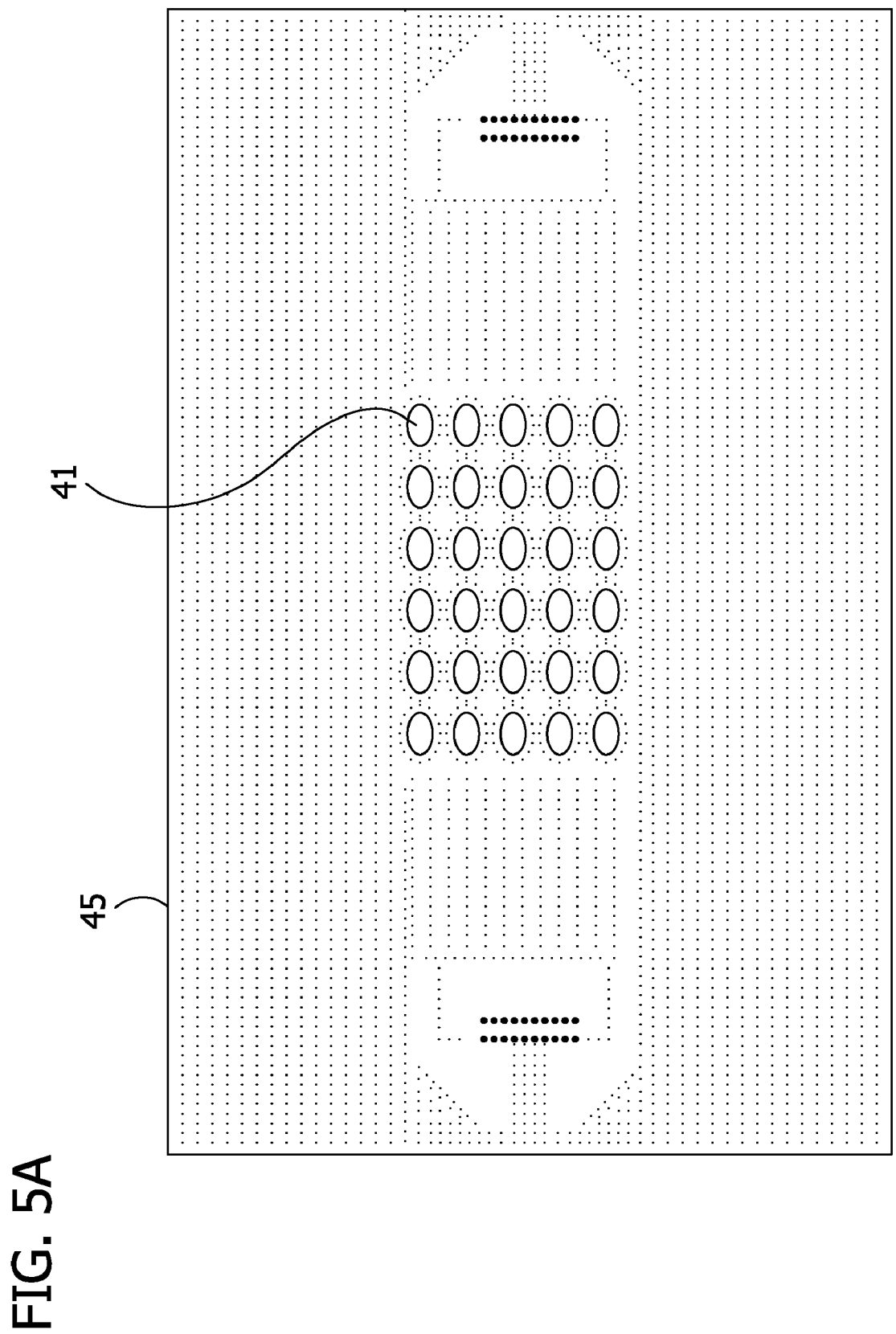
FIGS. 5A and 5B illustrate top and bottom layers, respectively, of an imaging system having a K-band slot array according to an embodiment of the invention.
Figure 5B:
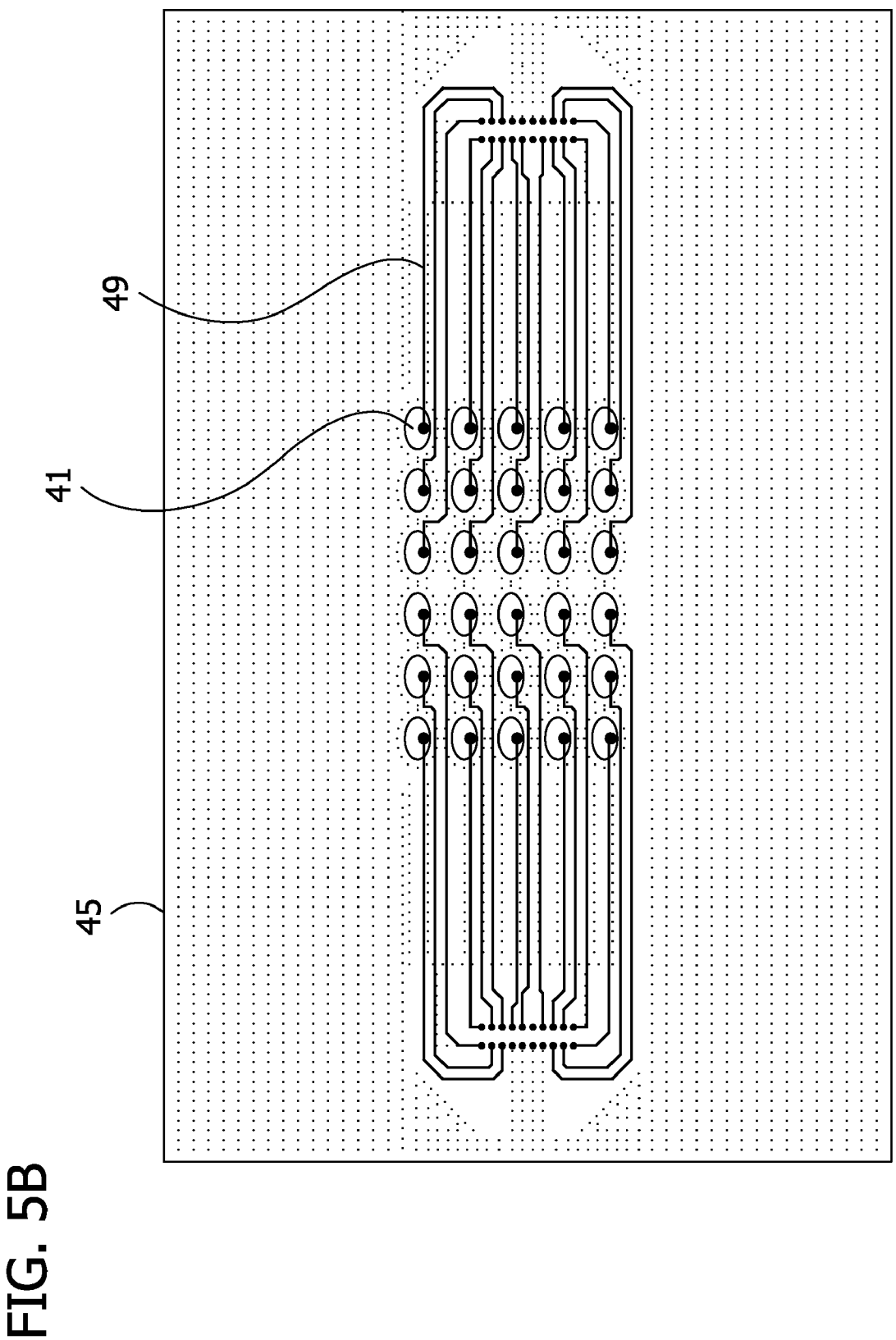

Referring further to an embodiment in which sensors 25 comprise modulated slot antennas, such as shown in FIGS. 5A and 5B, the sensor elements comprise modulated slots 41 cut into the conducting screen 45. FIG. 5A is a top layer while FIG. 5B is a bottom layer of array 23 embodying aspects of the invention.

In the exemplary embodiment of FIGS. 5A and 5B, array 23 comprises a K-band slot array manufactured according to standard photolithographic printed-circuit board (PCB) manufacturing techniques on a Rogers4350 board of 0.020" (0.5 mm) thickness. The implementation of FIGS. 5A and 5B permits a through transmission configuration where array 23 acts as a receiver in the far-field region of a transmitting open-ended K-band rectangular waveguide. In this instance, the waveguide provides the illuminating electric field. The distance between the waveguide, or transmitter, and the array 23 is, for example, 80 mm. The electric field distribution due to the incident field radiated by the transmitting open-ended waveguide is measured and used as a reference to correct for the distortion caused by array 23.

Figure 6A:
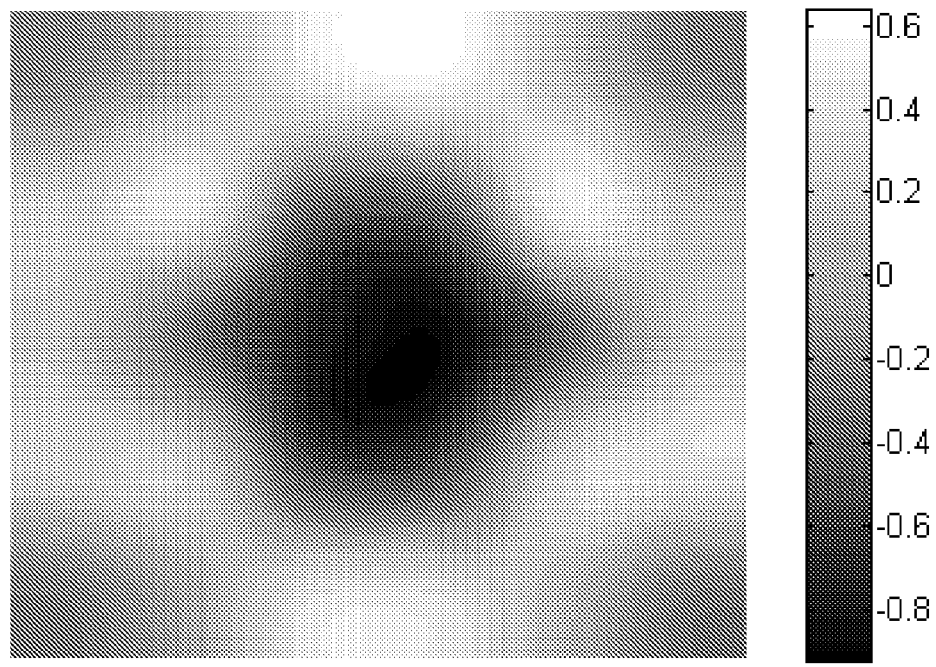
FIGS. 6A and 6B are exemplary images of an object obtained by the imaging system of FIGS. 5A and 5B.
Figure 6B:
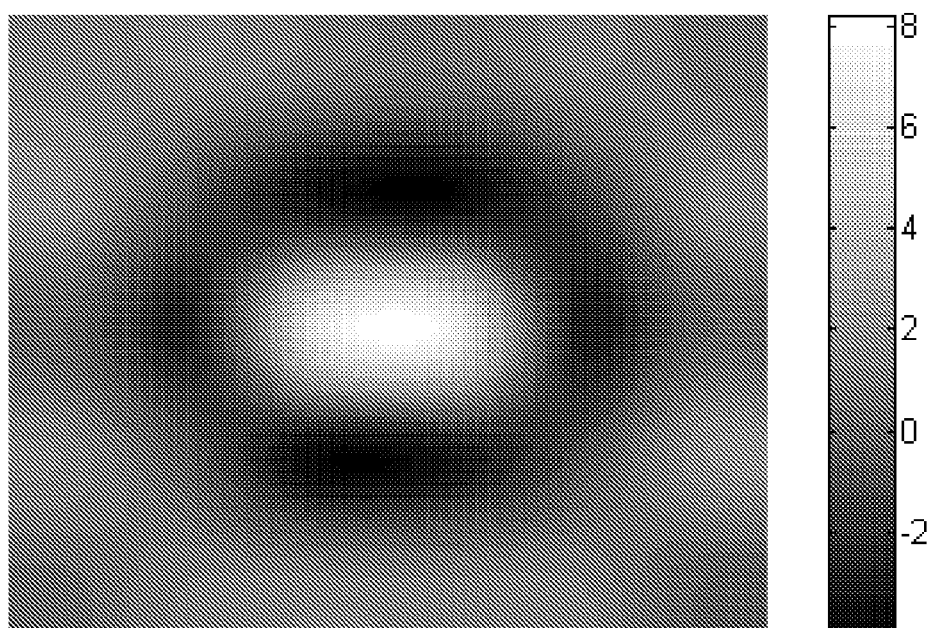

Imaging the target object 29 in accordance with the exemplary embodiment of FIGS. 5A and 5B yields the exemplary images of FIGS. 6A and 6B. In particular, FIGS. 6A and 6B show the magnitude (dB) and phase (degrees), respectively, of the measured electric field scattered by a relatively small metallic sphere (e.g., 4 mm in diameter) at a distance of 5 mm from the array 23.

Referring further to FIGS. 6A and 6B, processor 37 in this embodiment up-samples (e.g., 20 times) the field distributions and spatially interpolates the data to produce a more representative image of the electric field distribution than that directly obtained by the sensors 25 (i.e., a total of 30 pixels) provided by the array 23 of FIGS. 5A and 5B. The images are measured and processed in real-time (e.g., under 15 milliseconds). FIG. 6A clearly shows an indication of the sphere as a low intensity region (dark).

Figure 7A:
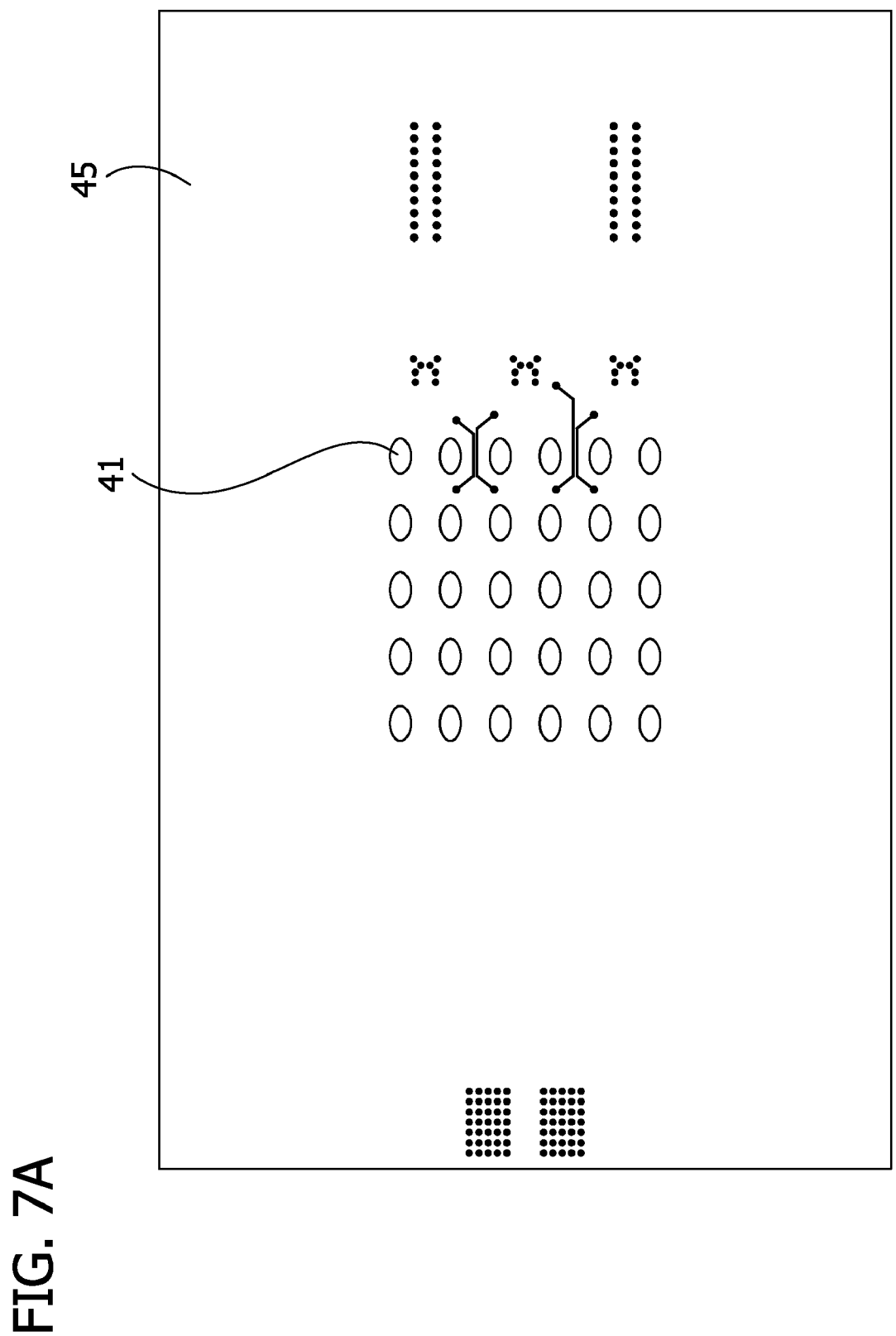
FIGS. 7A and 7B illustrate top and bottom layers, respectively, of an imaging system having an array of modulated slot antennas and a pickup network for receiving signals from the slot antennas according to an embodiment of the invention.
Figure 7B:
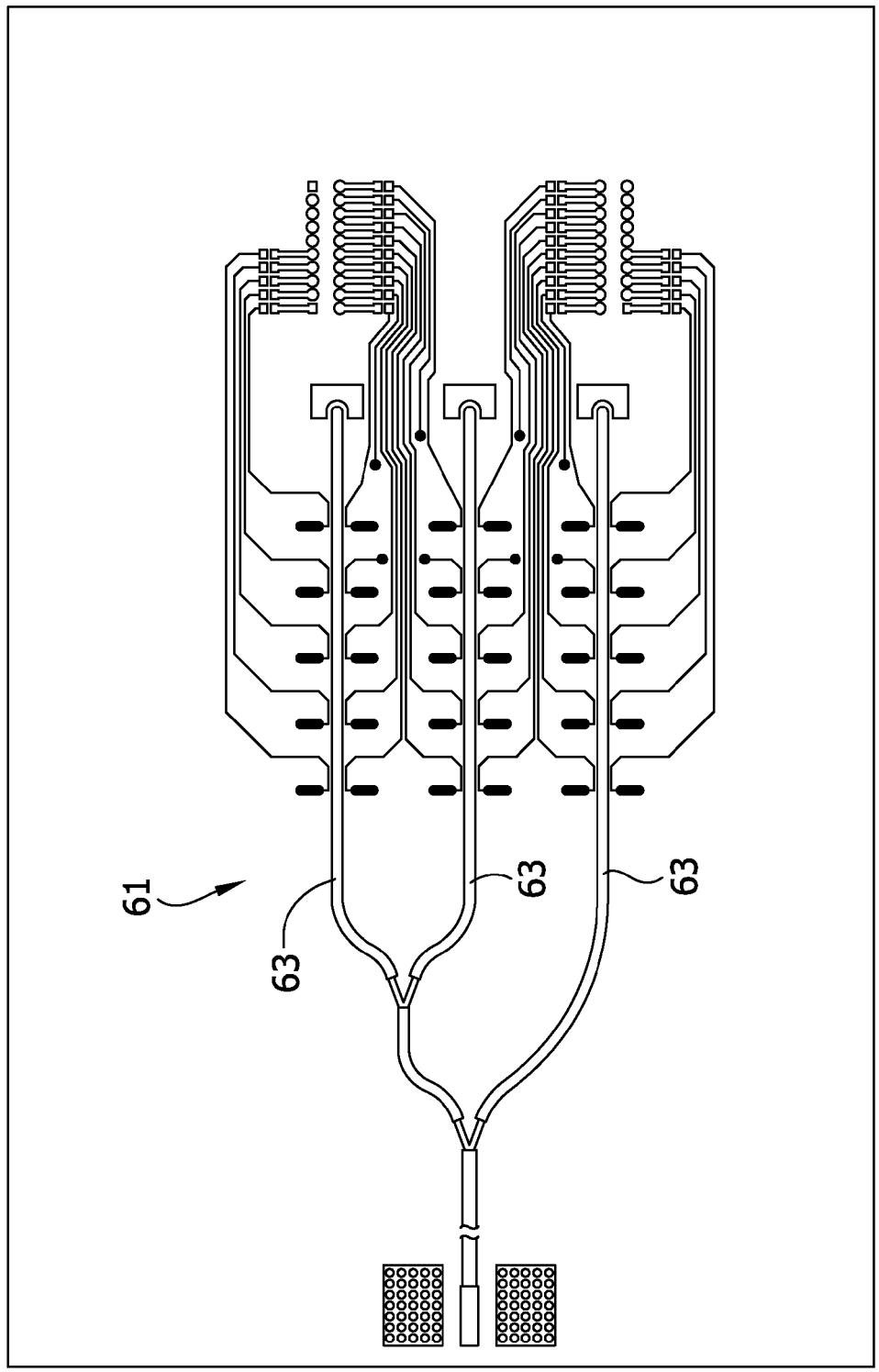

In an alternative embodiment, receiver 35 comprises a pickup network of combiners/dividers and microstrip/strip lines manufactured on a PCB as shown in FIGS. 7A and 7B. FIG. 7A illustrates a top layer and FIG. 7B illustrates a bottom layer of this alternative embodiment of imaging system 21. Relatively wide-band slots fed by microstrip lines/striplines can be modulated (e.g., switched ON or OFF) by providing a controlled RF connection to the pickup network of combiners/dividers that route the signal to a single receiving point where the receiver is attached. The RF connection between each slot 41 and the pickup network is controlled by a PIN diode mounted between the feeding line and the pickup network branch routed to the slot location. In this embodiment, the feeding line is located behind the slot 41 on the other side of the board. The field incident on slot 41 is coupled to or decoupled from the pickup network by switching the PIN diode ON or OFF, respectively.

Another feature of this implementation is the low-profile and light weight array 23. Furthermore, the coupled signal from each slot 41 undergoes very small attenuation before it finally reaches the receiving point, which results in a relatively high SNR. On-board RF signal conditioning, such as filtering and amplification, can be incorporated within the same pickup network of receiver 35. For measurement diversity and averaging purposes, multiple receiving points can be used as well.

To illustrate the potential of this design, array 23 comprises 30 slots (6 by 5) with spacing of $\lambda_0/2$ (where $\lambda_0$ is the free space wavelength) and operating at a frequency of 24 GHz. The array 23 of this embodiment is manufactured using the same technique and board material as described above. The array 23 slots are etched on the top layer of the board as shown in FIG. 7A. A 50Ω pickup network 61 consisting of Wilkinson dividers, microstrip lines, and termination structures are etched on the bottom layer of the board as shown in FIG. 7B. At the receiving port, a side-launch PCB RF connector, for example, provides a receiver connection and the PIN diodes are DC biased using an on-board connector. As shown in FIG. 7B, three microstrip line branches 63 each collect the signal coupled from 10 of the 30 slots 41. The slots 41 and their feeding lines are arranged in duplets on each branch line and the duplet slots mirror each other with respect to the branch line in this embodiment.

Figure 8A:
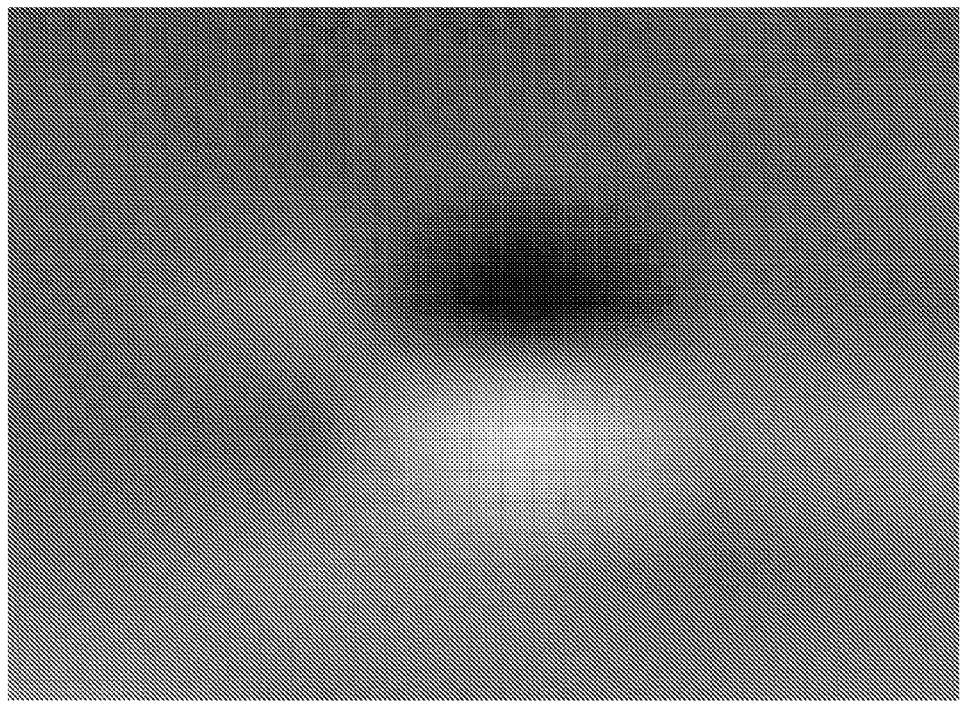
FIGS. 8A and 8B are exemplary images of an object obtained by the imaging system of FIGS. 7A and 7B.
Figure 8B:
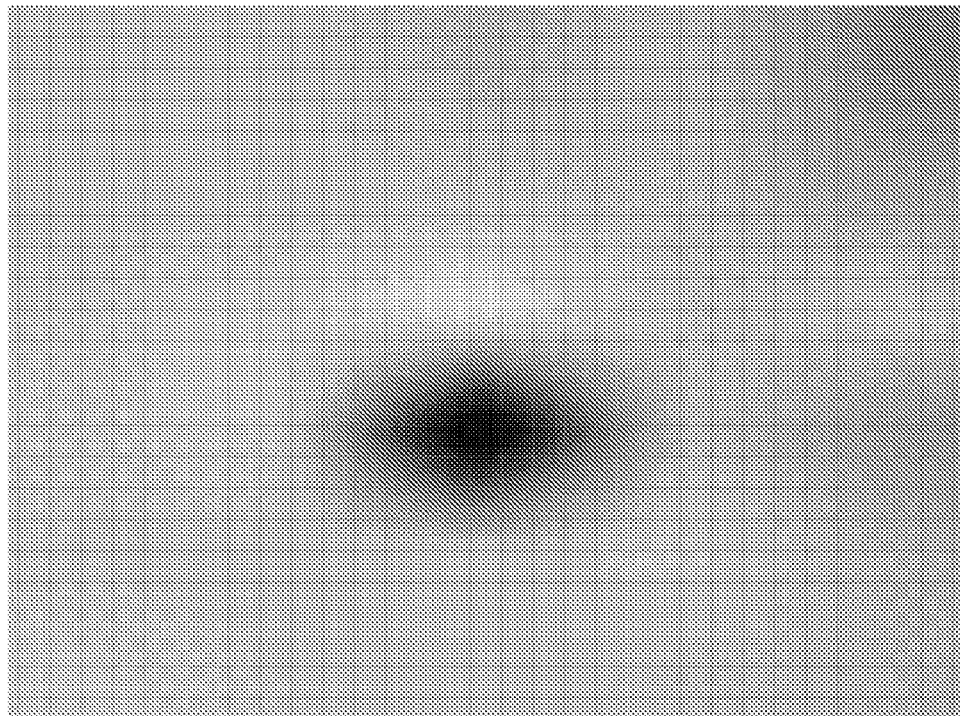

Imaging the target object 29 in accordance with the exemplary embodiment of FIGS. 7A and 7B yields the exemplary images of FIGS. 8A and 8B. In particular, FIGS. 8A and 8B show the magnitude (dB) and phase (degrees), respectively, of the measured electric field scattered by a relatively small metallic sphere (e.g., 9 mm in diameter) at a distance of 20 mm from the array 23. Operating in an active imaging mode, the array 23 illuminates the field of view with a microwave signal, and receives and samples the scattered field at the same time. FIGS. 8A and 8B show the obtained magnitude and phase images, respectively, of the sphere. The same calibration and interpolation schemes described above may be used to produce these images.

Figure 9:
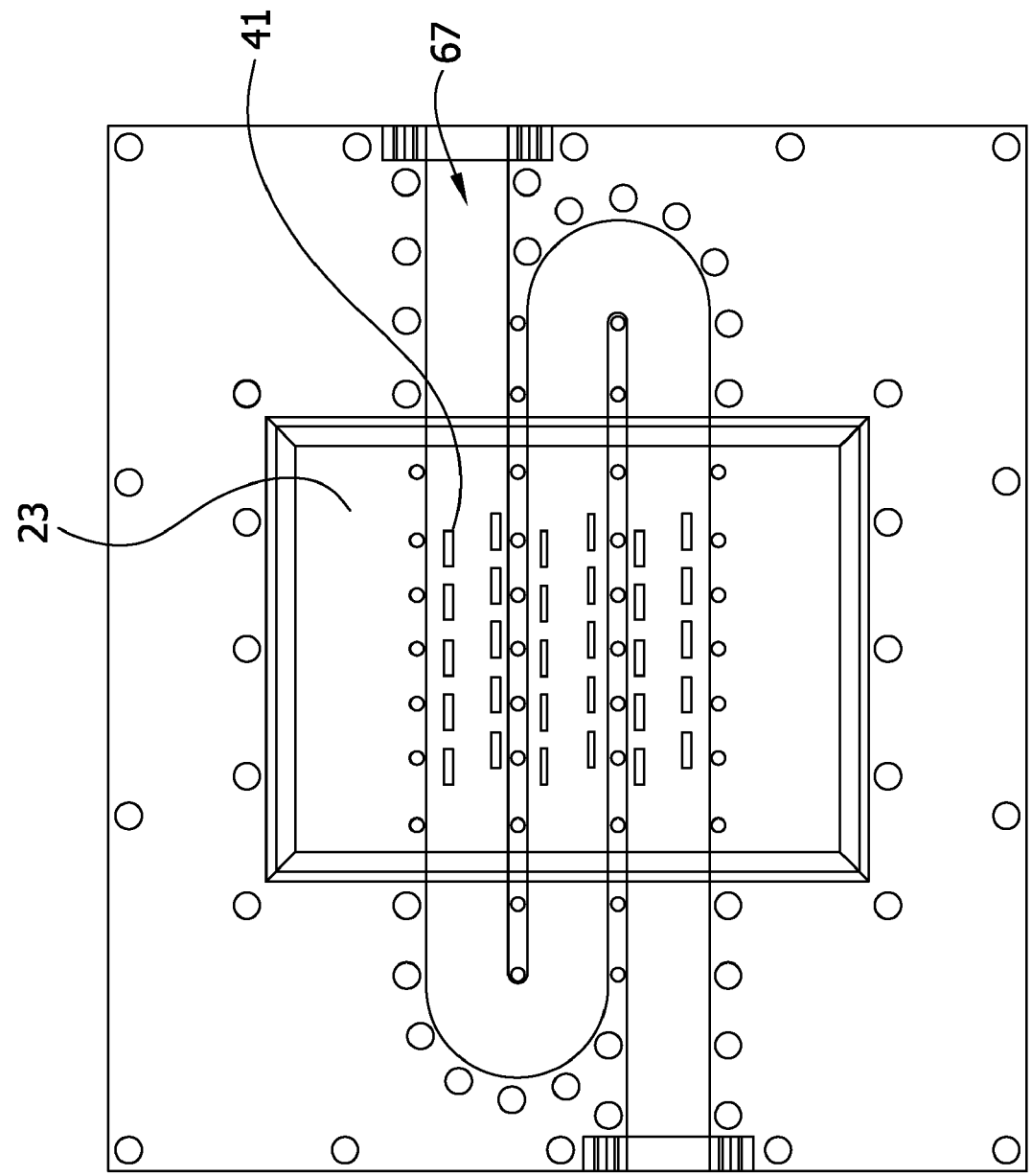
FIG. 9 illustrates an imaging system having an array of modulated slot antennas and a rectangular waveguide pickup for receiving signals from the slot antennas according to an embodiment of the invention.

FIG. 9 illustrates yet another embodiment, wherein modulated slots 41 are cut into the broad or narrow walls of metallic/dielectric waveguide sections.

Referring further to FIG. 9, this embodiment comprises a microwave system in which a rectangular waveguide pickup 67 embodies receiver 35. Here, the array 23 consists of the modulated slots 41 cut into the broad or narrow walls of metallic/dielectric waveguide sections combined to one or more pickup points. The waveguide sections may be connected via waveguide bends/combiners. Advantageously, the waveguide 67 (i.e., receiver 35) provides for a low loss transmission line to collect and guide the signals. This feature allows for machining one waveguide into a single block tracing the area behind a large number of slots 41. The slots 41 on the waveguide 67 may be made wide-band or resonant to increase the SNR.

Depending on the location of each slot 41 with respect to the waveguide 67, an array with horizontal (along the waveguide) and/or vertical (orthogonal to the waveguide) polarization may be constructed. Furthermore, since the broad dimension of a standard waveguide is larger than $\lambda_0/2$, two rows of slots may be placed within the waveguide.

To illustrate the potential of this technique, a 24 GHz imaging system 21 has an array of 30 sub-resonant/wideband slots 41. As shown in FIG. 9, the slot size is, for example, 4 mm×1 mm. The small sub-resonant slots 41 in this embodiment allow for densely packing array 23 without affecting the performance of the waveguide 67. On each slot, active element 43, namely, a PIN diode is placed in the middle along the narrow side of the respective slot 41. Forward/reverse biasing the PIN diode changes the impedance of the slots 41, a phenomenon used to modulate the signal picked up through that slot. To pick up this modulated signal and route it to processor 37, the receiver 35 comprises rectangular waveguide 67 machined into, for example, a block of aluminum in three rows connected by two bends in which two waveguide openings connect either receivers or a transmitter and a receiver depending on the operational mode. Each straight section of the waveguide 67 houses two rows of slots 41, which are staggered to reduce interaction between them. The array 23 in this embodiment is built on a PCB using standard photolithographic technique. A PCB allows for easier placement of PIN diodes and feasible routing of DC bias lines 49. The PCB, which contains the slot array 23, sits on top of the waveguide 67. Increasing the modulation rate and subsequently match filtering (utilizing inherent averaging of modulation) increases the SNR of sub-resonant slots.

The microwave and millimeter wave imaging system 21 is useful in at least the following applications.

A. Rapid electric field measurements for antenna pattern measurements, specific absorption rate (SAR) measurements and radar cross section (RCS) measurements.

B. General microwaves and millimeter waves imaging.

C. Nondestructive testing of dielectric composites and material characterization.

D, Target localization and angle of arrival estimation.

E. Anti-collision devices.

F. EMI & EMC.

G. Ultra-wide band microwave and millimeter wave communication links.

H. Surveillance and security systems.

I. Detection of contraband.

An imaging system 21 embodying aspects of the invention comprises sensor array 23, which has a plurality of modulated slots 41 for detecting an electric field from object 29. The slots 41 are positioned at locations corresponding to a defined spatial domain located remotely from object 29. Also, the slots 41 each provide an output signal representative of the electric field detected at the respective location of the slot. The imaging system 21 further comprises a receiver 35 operatively connected to array 23 for receiving the output signals from the slots 41 and processor 37 configured to generate a multi-dimensional profile representative of the object 29 in the defined spatial domain based on the received output signals. Moreover, imaging system 21 includes display 31 for displaying an image of the multi-dimensional profile.

In another embodiment, imaging system 21 comprises a plurality of modulated slots 41 formed in conductive surface 45 at a plurality of locations. The locations correspond to a defined spatial domain located remotely from the object 29. The slots 41, receiving and responsive to electromagnetic energy at a frequency greater than ultra high frequency, detect an electric field from object 29 and each provide an output signal representative of the electric field detected at the respective location of the slot. The imaging system 21 further comprises receiver 35 operatively connected to the slots 41 for receiving the output signals representative of the electric field detected at the plurality of locations and processor 37 configured to generate a multi-dimensional profile representative of object 29 in the defined spatial domain based on the received output signals.

Yet another embodiment relates to a method of generating a multi-dimensional profile. The method comprises illuminating object 29 with an electric field that includes electromagnetic energy having a frequency greater than ultra high frequency scattered by the object 29 illuminated thereby. The method also includes sampling the scattered electric field at a plurality of locations via sensor array 23. The locations correspond to a defined spatial domain located remotely from object 29 and the array 23 includes modulated slot 41 at each of the locations for detecting the scattered electric field. The slots 41 each provide an output signal representative of the electric field detected at the respective location of the slot. The method further comprises receiving the output signals from the slots 41 and generating a multi-dimensional profile representative of the object 29 in the defined spatial domain based on the received output signals.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. An imaging system comprising:
    a conductive surface having a plurality of slots formed therein at locations corresponding to a defined spatial domain located remotely from an object;
    a plurality of active elements for modulating the slots, wherein each of the slots has at least one of the active elements connected thereacross for selectively modulating the slot, wherein the modulated slots comprise a sensor array for measuring an electric field from the object, and wherein each of the modulated slots provides an output signal representative of the electric field detected at the respective location of the modulated slot, and wherein the at least one of the active elements connected across each of the slots selectively changes the resonant frequency thereof;
    a receiver operatively connected to the array for receiving the output signals from the modulated slots;
    a processor configured to generate a multi-dimensional profile representative of the object in the defined spatial domain based on the received output signals from the modulated slots; and
    a display for displaying an image of the multi-dimensional profile.

2. The imaging system of claim 1, wherein the active elements each comprise a PIN diode electrically connected to the respective slot, and wherein the output signal of each of the modulated slots is representative of a phase and magnitude of the electric field detected at the respective location of the modulated slot.

3. The imaging system of claim 1, wherein each of the slots is linearly polarized.

4. The imaging system of claim 1, wherein the slots comprise one or more of the following types: sub-resonant, resonant, wide-band, reconfigurable resonant, and shape reconfigurable.

5. The imaging system of claim 1, wherein the sensor array is responsive to millimeter wave or microwave electromagnetic energy.

6. The imaging system of claim 1, wherein the sensor array is adjustable for measuring the electric field at different polarizations.

7. The imaging system of claim 1, wherein the sensors are dual-polarized sensor elements with electrical control over the polarization for measuring two orthogonal electric field components.

8. The imaging system of claim 1, wherein the sensor array samples the electric field from the object at the plurality of slots, and wherein the sensor array is movable in at least two orthogonal directions to increase image resolution by increasing a number of samples obtained per image.

9. The imaging system of claim 1, wherein the array is movable relative to the object.

10. The imaging system of claim 1, wherein the multi-dimensional profile comprises an image of the object in view.

11. The imaging system of claim 1, wherein the output signal of each of the slots has a unique identity corresponding to the respective location thereof in the sensor array, and wherein the processor is configured to generate a map of the measured electric field based on the unique identity of each of the output signals.

12. The imaging system of claim 1, wherein the receiver comprises a rectangular waveguide positioned behind the sensor array and having a resonant slot at its aperture for receiving one or more signals output from the slots.

13. The imaging system of claim 1, wherein the receiver comprises a pickup network of combiners/dividers and microstrip/strip lines manufactured on a printed circuit board.

14. The imaging system of claim 1, wherein the receiver comprises the modulated slots cut into a wall of a metallic/dielectric waveguide section.

15. The imaging system of claim 1, further comprising an electric field source for illuminating the object, said electric field comprising electromagnetic energy having a frequency greater than ultra high frequency and being scattered by the object illuminated thereby.

16. An imaging system comprising:
a plurality of modulated slots formed in a conductive surface at a plurality of locations, said locations corresponding to a defined spatial domain located remotely from an object, said modulated slots receiving and responsive to electromagnetic energy at a frequency greater than ultra high frequency for detecting an electric field from the object, said modulated slots each having an active element connected thereacross for selectively changing the resonant frequency thereof to modulate the modulated slot and providing an output signal representative of the electric field detected at the respective location of the modulated slot as a function of the resonant frequency thereof;
a receiver operatively connected to the modulated slots for receiving the output signals representative of the electric field detected at the plurality of locations; and
a processor configured to generate a multi-dimensional profile representative of the object in the defined spatial domain based on the received output signals from the modulated slots.

17. The imaging system of claim 16, wherein the active element comprises a PIN diode electrically connected to the respective slot at a location of maximum electric field strength, and wherein the output signal of each of the modulated slots is representative of a phase and magnitude of the electric field detected at the respective location of the modulated slot.

18. The imaging system of claim 16, wherein each of the slots is linearly polarized.

19. The imaging system of claim 16, wherein the slots comprise one or more of the following resonant modulation types: sub-resonant, resonant, wide-band, reconfigurable resonant, and shape reconfigurable.

20. The imaging system of claim 16 wherein the electric field comprises microwave or millimeter wave electromagnetic energy.

21. The imaging system of claim 16, wherein the receiver comprises a rectangular waveguide having a resonant slot at its aperture for receiving one or more signals output from the slots.

22. The imaging system of claim 17, wherein the receiver comprises a pickup network of combiners/dividers and microstrip lines manufactured on a printed circuit board.

23. The imaging system of claim 16, wherein the conductive surface comprises a waveguide having the slots formed therein.

24. The imaging system of claim 16, further comprising a display operatively connected to the processor for displaying an image of the multi-dimensional profile generated thereby.

25. The imaging system of claim 16, wherein the plurality of slots formed in the conductive surface comprise a sensor array, said sensor array being adjustable for measuring the scattered electric field at different polarizations.

26. The imaging system of claim 16, wherein the plurality of slots sample the electric field from the object, and wherein the conductive surface is movable in at least two orthogonal directions to increase image resolution by increasing a number of samples obtained from each of the slots.

27. A method of generating a multi-dimensional profile of an object, said method comprising:
illuminating the object with an electric field, said electric field comprising electromagnetic energy having a frequency greater than ultra high frequency and being scattered by the object illuminated thereby;
sampling the scattered electric field at a plurality of locations via a sensor array, said locations corresponding to a defined spatial domain located remotely from the object, said array including a modulated slot at each of the locations for detecting the scattered electric field, said modulated slot comprising an active element connected thereto for modulating the slot, said modulated slots each providing an output signal representative of the electric field detected at the respective location of the modulated slot, wherein the modulating comprises modulating each of the slots in the sensor array by selectively changing the resonant frequency thereof;
receiving the output signals from the modulated slots; and
generating a multi-dimensional profile representative of the object in the defined spatial domain based on the received output signals from the modulated slots of the sensor array.

28. The method of claim 27, further comprising displaying an image of the multi-dimensional profile.

29. The method of claim 27, further comprising linearly polarizing each of the slots.

30. The method of claim 27, further comprising adjusting the sensor array for measuring the scattered electric field at different polarizations.

31. The method of claim 30, wherein adjusting the sensor array comprises rotating the array about a central point.

32. The method of claim 27, wherein sampling the electric field comprises moving the sensor array to increase image resolution by increasing a number of samples obtained from each of the slots.

33. The method of claim 32, wherein moving the sensor array comprises translationally displacing the sensor array in one or more orthogonal directions.

34. The method of claim 27, wherein sampling the electric field comprises moving the sensor array relative to the object to scan the scattered electric field.

35. The method of claim 27, further comprising loading each of the slots via the active element electrically connected thereto.

36. The method of claim 27, wherein receiving the output signals from the slots comprises positioning a rectangular waveguide behind the sensor array, said waveguide having a slot at its aperture for receiving one or more signals output from the slots.

37. The method of claim 27, wherein receiving the output signals from the slots comprises receiving one or more signals output from the slots at a pickup network of combiners/dividers and microstrip/strip lines.

* * * * *